(12) United States Patent
Vargas

(10) Patent No.: US 11,313,505 B2
(45) Date of Patent: Apr. 26, 2022

(54) PIPE DIVERTING SYSTEM

(71) Applicant: Solar Roof Jack Inc., El Dorado, CA (US)

(72) Inventor: Christopher Vargas, El Dorado, CA (US)

(73) Assignee: Solar Roof Jack Inc., El Dorado, CA (US)

( * ) Notice: Subject to any disclaimer, the term of this patent is extended or adjusted under 35 U.S.C. 154(b) by 139 days.

(21) Appl. No.: 16/907,008

(22) Filed: Jun. 19, 2020

(65) Prior Publication Data

US 2021/0071796 A1 Mar. 11, 2021

Related U.S. Application Data

(63) Continuation of application No. 16/256,917, filed on Jan. 24, 2019, now abandoned, which is a continuation of application No. 15/457,022, filed on Mar. 13, 2017, now abandoned.

(60) Provisional application No. 62/307,919, filed on Mar. 14, 2016.

(51) Int. Cl.
*F16L 43/02* (2006.01)
*E04D 13/147* (2006.01)
*H02S 20/23* (2014.01)
*E04D 13/17* (2006.01)
*H01L 31/042* (2014.01)
*F24F 7/02* (2006.01)

(52) U.S. Cl.
CPC .......... *F16L 43/02* (2013.01); *E04D 13/1476* (2013.01); *E04D 13/17* (2013.01); *H01L 31/042* (2013.01); *H02S 20/23* (2014.12); *F24F 7/02* (2013.01); *Y02B 10/10* (2013.01); *Y02E 10/50* (2013.01)

(58) Field of Classification Search
CPC ........ F16L 43/02; E04D 13/143; E04D 13/14; E04D 13/1476; E04D 9/02
See application file for complete search history.

(56) References Cited

U.S. PATENT DOCUMENTS

| | | | |
|---|---|---|---|
| 1,623,659 | A | 4/1927 | Comerford |
| 1,683,548 | A | 9/1928 | Hughey |
| 3,524,400 | A | 8/1970 | Magi |
| 3,895,467 | A | 7/1975 | Clement |
| 4,102,090 | A | 7/1978 | Anguish |
| 4,599,828 | A | 7/1986 | Ishikura |
| 4,895,065 | A | 1/1990 | Lamparter |

(Continued)

*Primary Examiner* — Paola Agudelo
(74) *Attorney, Agent, or Firm* — David Millers

(57) ABSTRACT

A roof mounted diverting device for diverting a direction of flow of gas from a roof-penetrating pipe is provided. The roof-penetrating pipe has a central axis. The device includes a diverter having a lower opening and an upper opening, the upper opening having a central axis; and a seal having a seal opening, the seal opening being con figured to contact an outer surface of the roof-penetrating pipe and form a gas-tight seal with the roof-penetrating pipe. In an assembled state of the device, any of the gas that enters the diverter can only exit the diverter through the upper opening or through the roof-penetrating pipe, and the diverter is installable in multiple different positions, each of die different positions having a different included angle between the central axis of the upper opening and the central axis of the roof-penetrating pipe.

20 Claims, 17 Drawing Sheets

(56) References Cited

U.S. PATENT DOCUMENTS

| | | |
|---|---|---|
| 5,129,387 A | 7/1992 | Behrens |
| 6,102,794 A | 8/2000 | Cline |
| 6,183,360 B1 | 2/2001 | Luter, II et al. |
| 6,543,187 B1 | 4/2003 | Menzies |
| 7,389,616 B2 | 6/2008 | Gilleran |
| 7,901,278 B2 | 3/2011 | O'Hagin |
| 8,307,590 B2 | 11/2012 | Smith |
| 8,522,497 B2 | 9/2013 | Saikkonen |
| 2004/0093813 A1 | 5/2004 | Sigrist et al. |
| 2005/0011137 A1* | 1/2005 | Baker .................. E04D 1/18 52/22 |
| 2006/0223437 A1* | 10/2006 | O'Hagin ............ E04D 13/17 454/366 |
| 2007/0272341 A1 | 11/2007 | Khan et al. |
| 2012/0073221 A1 | 3/2012 | Eero |
| 2012/0090263 A1 | 4/2012 | Schaefer et al. |
| 2016/0053499 A1* | 2/2016 | West .............. E04D 13/1476 52/218 |

\* cited by examiner

PIPE DIVERTING SYSTEM

CROSS-REFERENCE TO RELATED APPLICATION

This patent document is a continuation of U.S. patent application Ser. No. 16/256,917, filed May 13, 2017, which is a continuation of U.S. patent application Ser. No. 15/457,022, filed May 13, 2017, which claims the benefit of U.S. Provisional Application No. 62/307,919, filed Mar. 14, 2016, which is incorporated by reference in its entirety.

FIELD

The present invention relates to pipe diverting systems. Particular embodiments of the invention relate to systems and methods for diverting a ventilation pipe on a roof so that another system, such as a solar panel array, can be accommodated.

BACKGROUND

Many commercial and residential buildings have pipes, such as plumbing vent stacks, that penetrate the building's roof and extend vertically a required distance from the roof surface. This distance can be several inches to a foot or more.

With the high cost of electricity in many areas, roof mounted solar panels are becoming increasingly more popular and are even mandated in some jurisdictions.

Most jurisdictions have building department guidelines or codes that determine how a solar panel array can be positioned on a roof, including the required distance between the roof surface and the underside of the panels. On occasion, roof-penetrating pipes fall directly in line with a desired panel layout. The minimum required distance that the outlet of the pipe must be above the roof surface is usually greater than the desired (or required) distance between the roof surface and the solar panels. As a result, panel layouts are designed to avoid these pipes when possible, but in some cases it is not possible to position the panels so that every pipe is avoided. Therefore, the solar panel layout is often designed with voids where no panels can be placed so that the pipe can extend the required distance above the roof surface. The result is open areas of seemingly unusable prime power production space, resulting in lower overall power production.

Moving the roof-penetrating pipe from the interior of the attic space and re positioning in another location is time consuming, costly, and, in some cases, impractical or impossible.

Systems and methods for moving the vertical portion of the roof-penetrating pipe without having to move the portion of the pipe that penetrates the roof would allow more uniform and complete solar panel installations without suffering the drawbacks described above. Wasted space would be reduced and panel layout would no longer have to avoid the spots directly above each roof penetration. Higher power output would result as more prime locations would be usable.

SUMMARY

As described above, roof-penetrating pipes can cause undesirable voids in an array of solar panels. Embodiments of the invention solve tins problem by providing systems and methods of rerouting the pipe above the roof surface without having to move the portion of the pipe that penetrates the roof.

Embodiments of the invention divert the pipe to one side of any solar panel without the need to move the portion of die pipe that penetrates the roof and close the existing exit hole. The space directly around and above the pipe becomes usable and the array layout can be more consistent and uniform, ultimately using prime space for better power generation.

Embodiments of the invention differ from what currently exists. Layouts currently avoid these pipe exiting spaces as unusable power production space. Embodiments of the invention make theses spaces usable and no longer an obstacle. As a result, additional panels can be set in the prime roof locations resulting in more power production from the array.

Particular embodiments of die invention provide a roof mounted diverting device for diverting a direction of flow of gas from a roof-penetrating pipe, the roof-penetrating pipe having a central axis. The device includes a diverter having a lower opening and an upper opening, the upper opening having a central axis: and a seal having a seal opening, the seal opening being configured to contact an outer surface of the roof-penetrating pipe and form a gas-light seal with the roof-penetrating pipe. In an assembled state of the device, any of the gas that enters the diverter can only exit the diverter through the upper opening or through the roof-penetrating pipe, and the diverter is installable in multiple different positions, each of the different positions having a different included angle between the central axis of the upper opening and the central axis of the roof-penetrating pipe.

In some embodiments, in an assembled state, the diverter is configured to remain out of contact with the roof-penetrating pipe.

Some embodiments include a mounting plate that is attached to the diverter.

In some embodiments, the mounting plate is removably attached to the diverter.

In some embodiments, the mounting plate is configured to be attached to the roof.

In some embodiments, the mounting plate is configured to extend under an outer layer of the roof when the device is in an installed state.

In some embodiments, the seal is a gasket configured to mount between the roof and the diverter, and the seal opening is an opening in the gasket.

In some embodiments, the seal is configured to maintain the gas-light seal at different rotational positions relative to the central axis of the roof-penetrating pipe.

In some embodiments, the seal is configured to maintain the gas-tight seal at any rotational position relative to the central axis of the roof-penetrating pipe.

Particular embodiments of the invention provide a system for diverting a direction of flow of gas from a roof-penetrating pipe, the roof-penetrating pipe having a central axis. The system includes a diverter having a lower opening and an upper opening, the upper opening having a central axis; a seal having a seal opening, the seal opening being configured to contact an outer surface of the roof-penetrating pipe and form a gas-tight seal with the roof-penetrating pipe; a first tube section that extends from the diverter and is attached to the diverter in a gas-tight manner; a second tube section that extends vertically away from the roof; and an angled tubular portion attached to the first tube section and the second tube section such that the first tube section and the second tube section are attached to each other in a gas-tight manner. In an assembled state of the system, any of the gas that enters the diverter can only exit the system through the second tube section or through the roof-penetrating pipe, and the diverter is installable in multiple different positions, each of the different positions having a different included angle between the central axis of the upper opening and the central axis of the roof-penetrating pipe.

In some embodiments, the seal is configured to maintain the gas-tight seal at any rotational position relative to the central axis of the roof-penetrating pipe.

Particular embodiments of the invention provide a method of diverting a direction of flow of gas from a roof-penetrating pipe that penetrates a roof. The method includes providing a diverter having a lower opening and an upper opening; mounting the diverter to the roof; and providing a seal having a seal opening, the seal opening contacting an outer surface of the roof-penetrating pipe and forming a gas-light seal with the roof-penetrating pipe. In an assembled state of the device, any of the gas that enters the diverter can only exit the diverter through the upper opening or through the roof-penetrating pipe, and the diverter is installable in multiple different positions, each of the different positions having a different included angle between a central axis of the upper opening and a central axis of the roof-penetrating pipe.

In some embodiments, in an assembled state, the diverter remains out of contact with the roof-penetrating pipe.

In some embodiments, the diverter is attached to a mounting plate.

In some embodiments, the mounting plate is removably attached to the diverter.

In some embodiments, the mounting plate is attached to the roof.

In some embodiments, the mounting plate extends under an outer layer of the roof when the device is in an installed state.

In some embodiments, the seal is a gasket mounted between the roof and the diverter, and the seal opening is an opening in the gasket.

In some embodiments, the seal maintains the gas-tight seal at different rotational positions relative to the central axis of the roof-penetrating pipe.

In some embodiments, the seal maintains the gas-tight seal at any rotational position relative to the central axis of the roof-penetrating pipe.

BRIEF DESCRIPTION OF THE DRAWINGS

The present invention will become more fully understood from the detailed description and the accompanying drawings, wherein.

Figure 1:
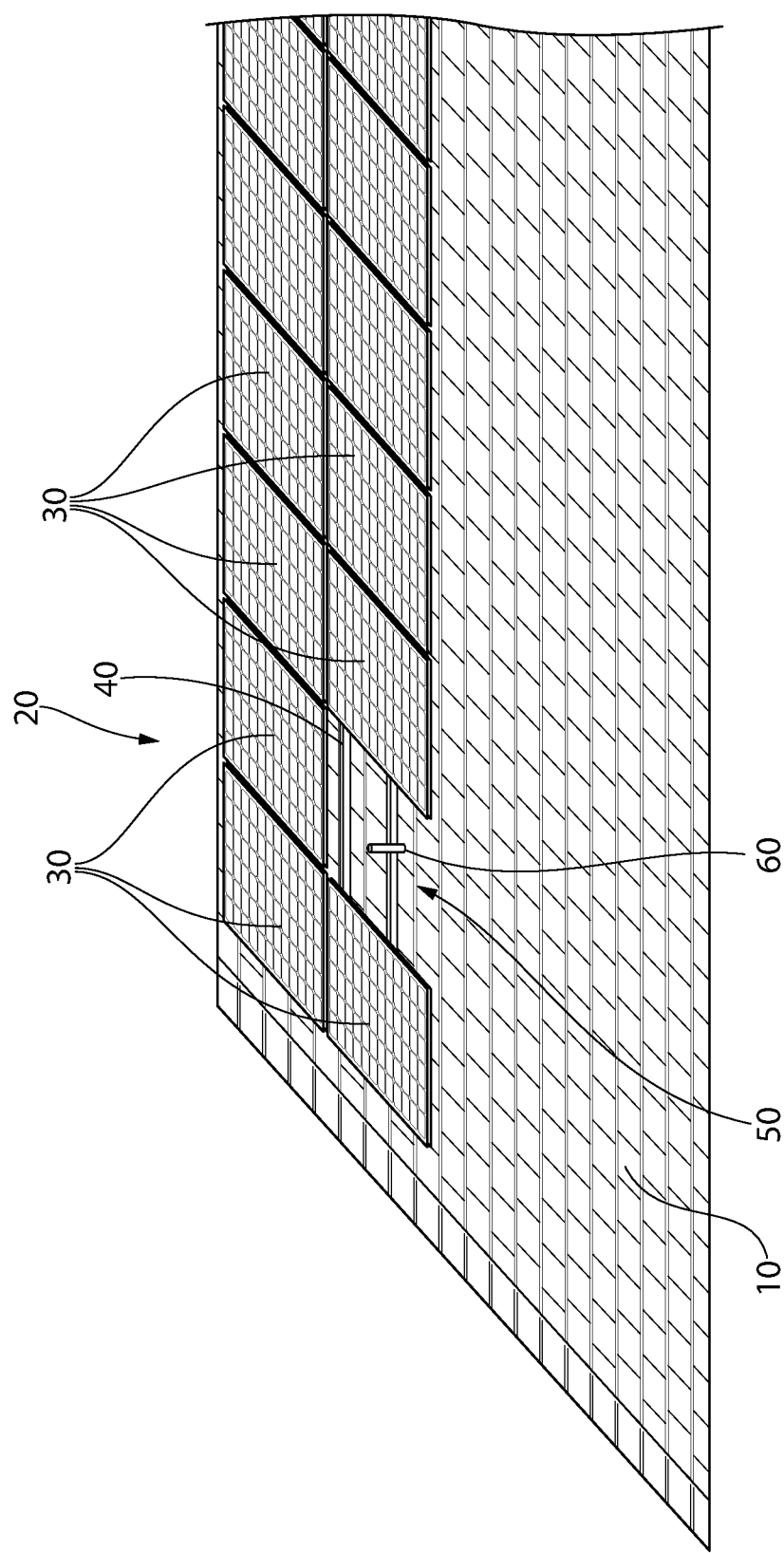
FIG. 1 is a perspective view of a solar panel installation.

All drawings are schematic and not necessarily to scale. Parts given a reference numerical designation in one figure may be considered to be the same parts where they appear in other figures without a numerical designation for brevity unless specifically labeled with a different pan number and described herein.

DETAILED DESCRIPTION

The following description of the preferred embodiments is merely exemplary in nature and is in no way intended to limit the invention, its application, or uses.

In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly" etc.) should be construed to refer to the orientation as then described or as shown in the drawing under discussion. These relative terms are for convenience of description only and do not require that the apparatus be constructed or operated in a particular orientation. Terms such as "attached," "connected," "coupled," "interconnected," and similar refer to a relationship wherein structures are secured or attached to one another either directly or indirectly through intervening structures, as well as both movable or rigid attachments or relationships, unless expressly described otherwise. The term "fixed" refers to two structures that cannot be separated without damaging one of the structures. The term "filled" refers to a state that includes completely filled or partially filled.

As used throughout, ranges are used as shorthand for describing each and every value that is within the range. Any value within the range can be selected as the terminus of the range. In addition, all references cited herein are hereby incorporated by reference in their entireties. In the event of a conflict in a definition in the present disclosure and that of a cited reference, the present disclosure controls.

The term "opening" as used in this application can refer to any passageway through which air can travel.

As explained above, it can be beneficial to reroute the above-roof portion of a roof-penetrating pipe in order to accommodate another roof mounted system, such as an array of solar panels.

Embodiments of the invention provide a path for air/gases exiting the, for example, plumbing ventilation pipes of any structure to be diverted from a current location to another more desirable location along the closest edge of any solar panel layout without interrupting the flow of air or minimizing tire flow as it escapes into the atmosphere. Embodiments of the invention provide a connection that does not interfere with the solar panels directly above while simultaneously allowing water and debris to freely pass around and under the solar panel without blocking the natural flow of this water, debris and air.

FIG. 1 shows an array of solar panels 30 arranged on a roof 10 of a residential structure. Solar panels 30 are arranged on a plurality of rails 40 in a uniform grid where panels 30 are located in rows and columns. A vent pipe 60 penetrates roof 10 and extends vertically a distance above the surface of roof 10. Due to the height of vent pipe 60, no solar panel can be located above vent pipe 60 and, as a result, a void 50 is created in the array. This void is unsightly and reduces the number of solar panels 30 in the array, which leads to a reduced power output.

Figure 2:
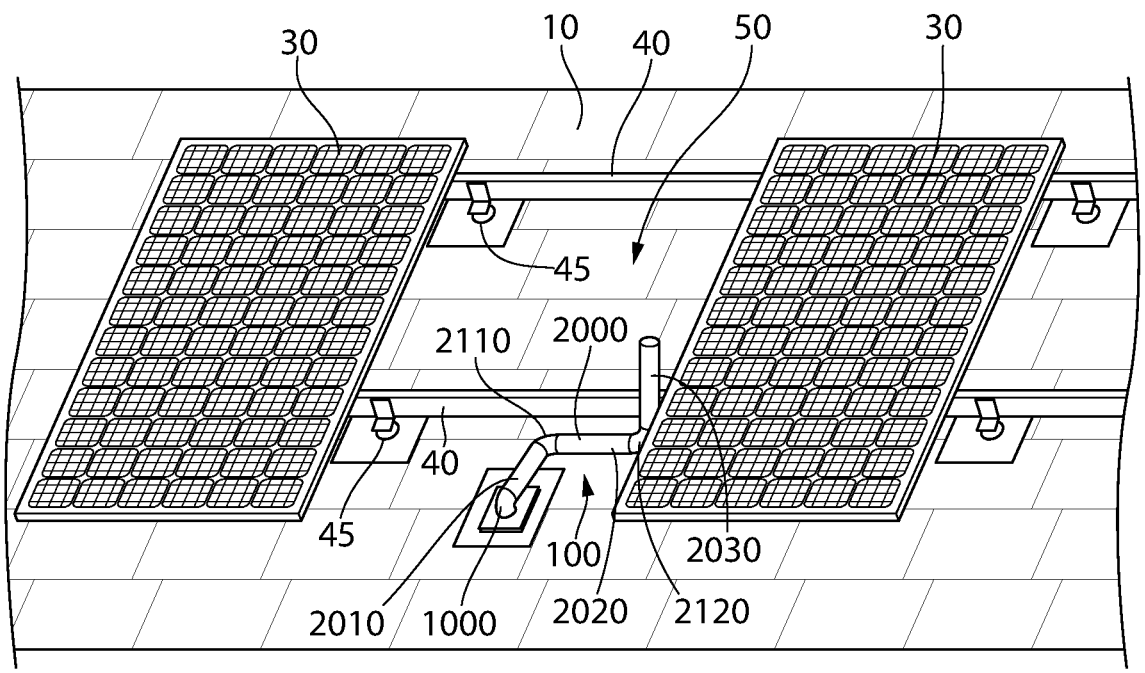
FIG. 2 is a perspective view of a solar panel installation and a pipe diverting system in accordance with embodiments of the invention.
Figure 3:
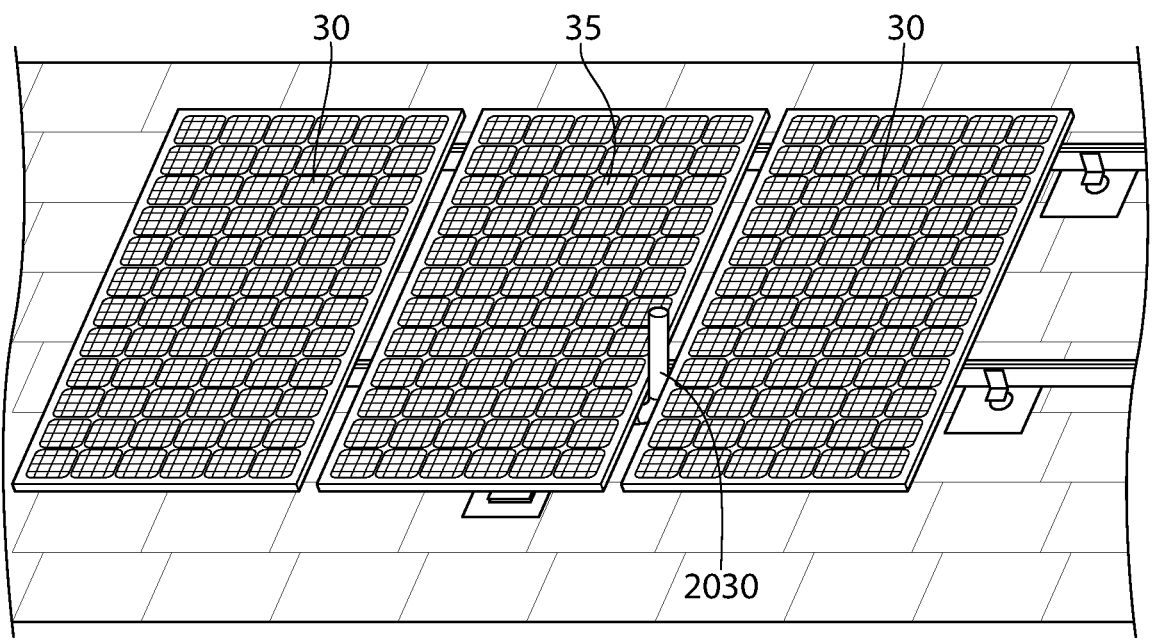
FIG. 3 is a perspective view of a solar panel installation and a pipe diverting system in accordance with embodiments of the invention.

FIGS. 2 and 3 show an example of a solar panel array benefiting from an embodiment of the invention. In FIGS. 2 and 3, two solar panels 30 are attached to roof 10 by way of rails 40 and supports 45. Void 50 was required before the use of the invention due to the location of a pipe penetrating roof 10 and extending vertically into void 50. A pipe diverting system 100 is used to reroute the pipe so that another solar panel 35 can be installed as part of the array. In this example, system 100 includes a diverting device 1000 that diverts gases from the pipe to a series of lubes and joints (collectively referred to as a tube system 2000). Tube system 2000 includes a first tube section 2010 that runs substantially parallel to the surface of roof 10 and is attached to diverting device 1000. A first angled tube section 2110 connects first tube section 2010 to a second tube section 2020 in order to change the direction of tube system 2000. Second tube section 2020 is also positioned substantially parallel to the surface of roof 10. A second angled tube section 2120 connects second tube section 2020 to a vertical tube section 2030 in order to route the gases to a vertical exit from tube system 2000. Second tube section 2020 is also positioned substantially parallel to the surface of roof 10. The route of tube system 2000 shown in FIGS. 2 and 3 is just one possible example. Other routes can be taken, such as moving horizontally out of diverting device 1000 to vertical lube section 2030. Other examples can route the gases from diverting device 1000 to a tube section running in the direction of second tube section 2020, then to a tube section running in the direction of first tube section 2010, and then to a vertical tube section. Other examples position diverting device 1000 at an angle other than that shown in FIGS. 2 and 3 and a position pointing 90 degrees to that position. Some jurisdictions may require the pipe sections to flow in such a way that the gases are never forced to travel downward. As a result, an installation where diverting device 1000 is positioned 180 degrees front the position shown in FIGS. 2 and 3 may not be allowed in some jurisdictions. Regardless of jurisdictional requirements, it is preferable in some situations to avoid trapping gas, especially plumbing vent gases, and as a result the gases should not be forced to flow downward. Although the example shown in FIGS. 2 and 3 shows tube section 2030 extending between two solar panels, other examples extend the tubing so that tube section 2030 is outside the array of solar panels.

FIG. 3 shows solar panel 35 in a position that is consistent with a uniform layout of the solar panels. As can be seen from the figures, this was permitted due to the rerouting of the vent pipe made possible by the invention. The installation shown in FIG. 3 not only provides more power than an array without solar panel 35, but it is also more esthetically pleasing.

Figure 4:
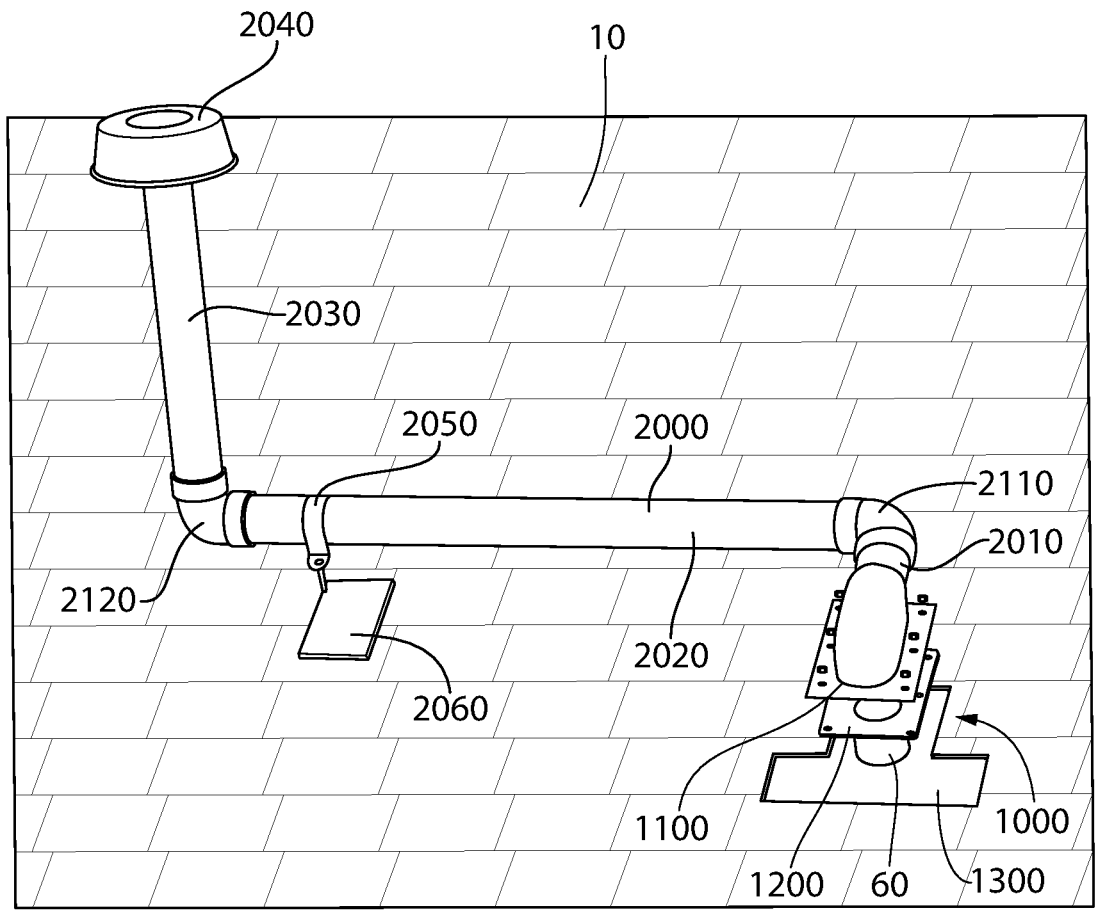
FIG. 4 is a perspective view of a pipe diverting system in accordance with embodiments of the invention.

FIG. 4 shows an example of an embodiment of the invention in a semi-assembled state detached from the roof for illustrative purposes. In FIG. 4, a diverter 1100 (part of diverting device 1000) is shown connected to tube system 2000. In this example, all of the connections between the pieces of tube system 2000 are permanent connections. In the case of polyvinyl chloride (PVC) piping, these connections are made using PVC cement. In the case of other piping, such as acrylonitrile butadiene styrene (ABS) piping, an appropriate permanent cement or other permanent fixing method is used. In some embodiments, some or all of these connections can be non-permanent so that sections can be easily replaced. These connections (permanent or non-permanent) are gas-proof so that the gases cannot exit live pipe anywhere but the exit end of tube section 2030. In the example shown in FIG. 4, the exit end of tube section 2030 is covered by a cap 2040 in order to prevent rain, debris and other unwanted items from entering tube section 2030. Some systems include a cap and some do not. FIG. 4 shows a mounting plate 1300 that is attached to roof 10 as a mounting point for diverter 1100 and a gasket 1200 so that diverter 1100 and gasket 1200 are secured in position over vent pipe 60 in a sealed manner (discussed in detail below). Also shown in FIG. 4 is an example of mounting hardware 2060 for attaching tube system 2000 to roof 10. This example of mounting hardware 2060 includes a plate attached to roof 10 and a strap that attaches a section of tube system 2000 to the plate with screws. Other hardware and methods of securely attaching tube system 2000 to roof 10 can also be used.

Figure 5:
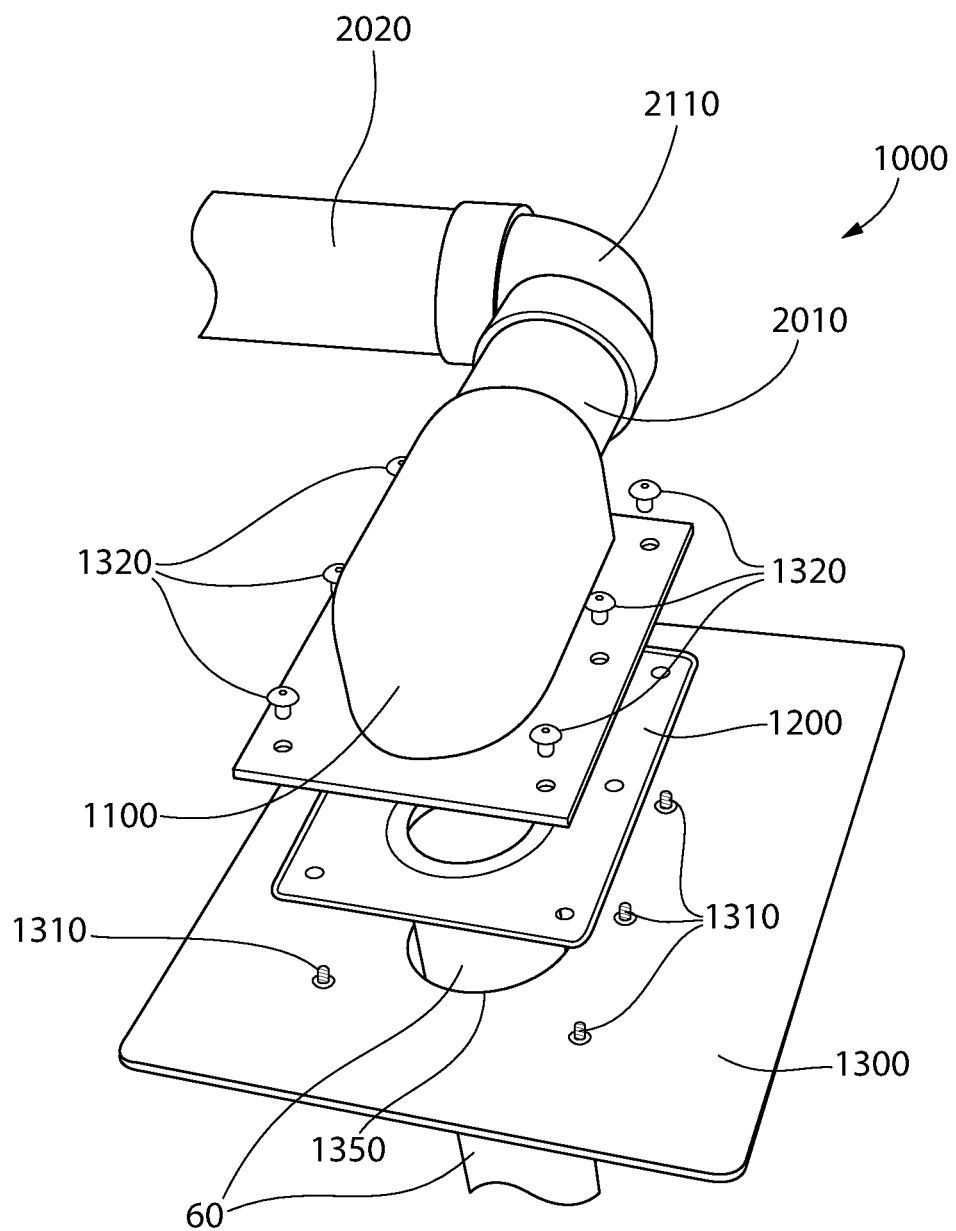
FIG. 5 is a partially exploded view of a pipe diverting system in accordance with embodiments of the invention.
Figure 6:
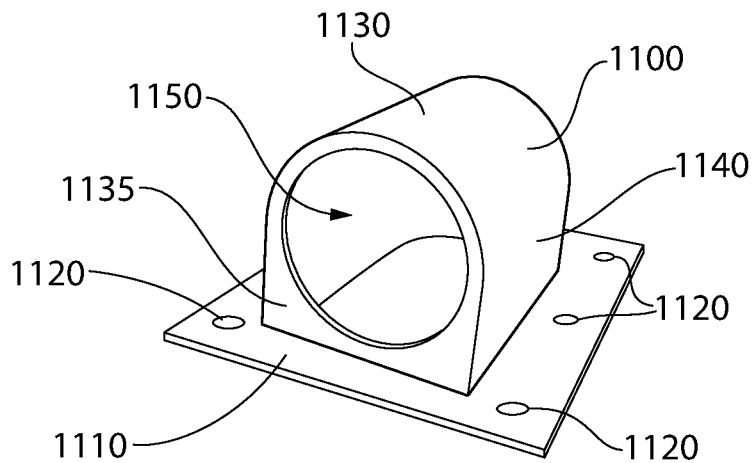
FIG. 6 is a perspective view of an example of a diverter in accordance with embodiments of the invention.

FIG. 5 shows the example of diverting device 1000 from FIG. 4 in more detail. A mounting plate 1300 is provided as a foundation for diverting device 1000. Mounting plate 1300 is, in this example, a flat plate that can be attached to roof 10 and then partially covered by roofing material (such as shingles) as shown in FIG. 4. Other examples of mounting plate 1300 can be a shape other than flat to follow the particular contour of other style roofs in order to provide a secure foundation for diverting device 1000. For example, some tile roofs have a wavy configuration which may be belter served by a mounting plate having a similarly wavy shape. Whatever the shape of mounting plate 1300, diverter 1100 and gasket 1200 must be properly shaped to form the desired seal with vent pipe 60 (discussed in more detail below). In this example, mounting plate 1300 has six mounting screws 1310 that protrude upwardly from an upper surface of mounting plate 1300. More or fewer mounting screws can be used and mounting fasteners other than screws can be used. Mounting plate 1300 is provided with a hole 1350 through which vent pipe 60 can extend.

A gasket 1200 is provided between mounting plate 1300 and diverter 1100. Gasket 1200 (shown in more detail in FIGS. 19 and 20) creates a gas-proof seal between mounting plate 1300 and diverter 1100 and has a hole that creates a gas-proof seal around vent pipe 60.

Diverter 1100 (shown in more detail in FIGS. 6-11) has a plurality of holes through which mounting screws 1310 extend. In this example, a cap screw 1320 engages with each of the mounting screws 1310 to secure diverter 1100 to mounting plate 1300 (and thus roof 10). Cap screws as shown in this example ensure that the proper spacing between diverter 1100 and mounting plate 1300 in maintained so that gasket 1200 provides a sufficient seal without being crushed. Other securing methods can be used to secure diverter 1100 to mounting plate 1300 as long as they do so in a way that assures that gasket 1200 provides the proper gas-proof seal.

Figure 10:
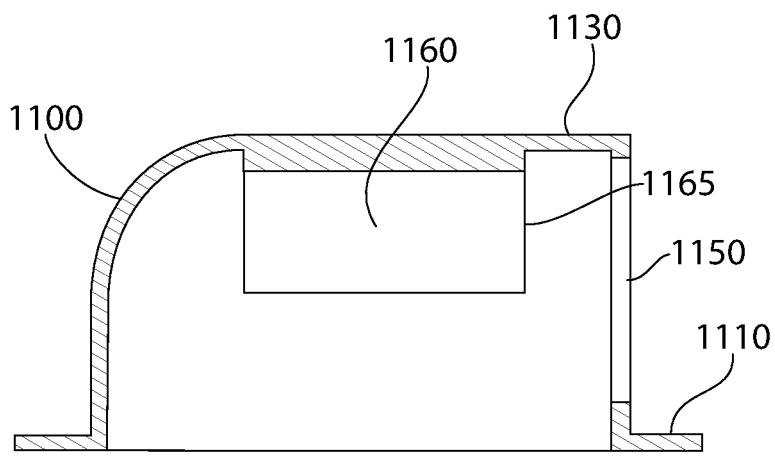
FIG. 10 is a sectional view of the diverter shown in FIG. 6.
Figure 11:
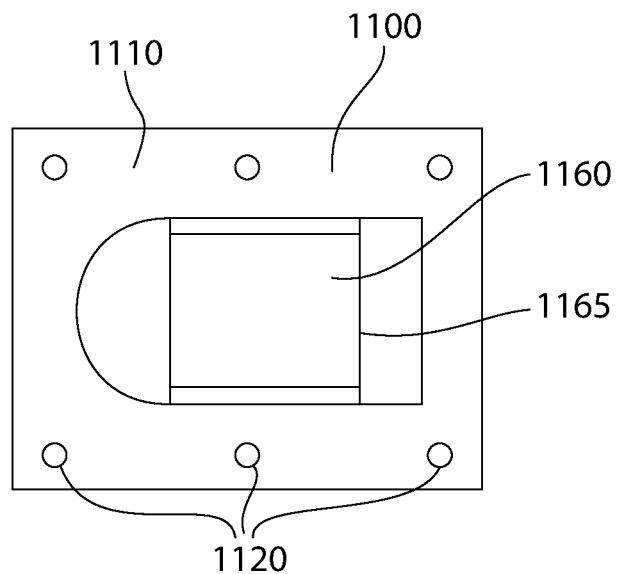
FIG. 11 is a bottom view of the diverter shown in FIG. 6.
Figure 12:
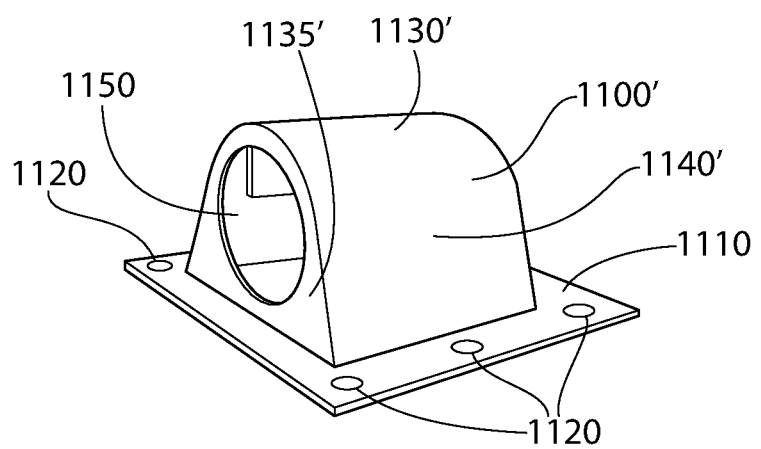
FIG. 12 is a perspective view of an example of a diverter in accordance with embodiments of the invention.
Figure 13:
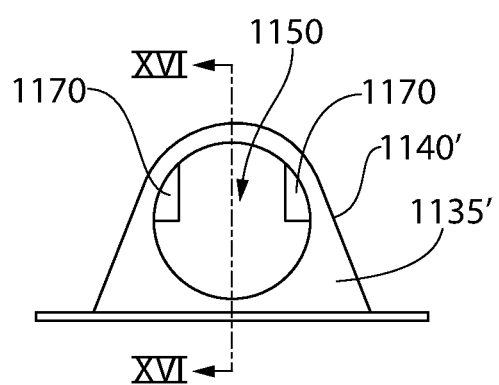
FIG. 13 is a front view of the diverter shown in FIG. 12.
Figure 14:
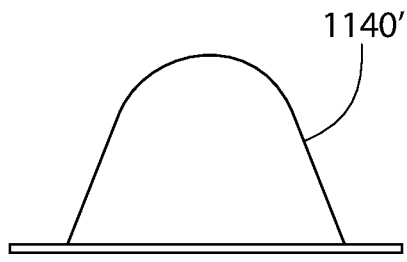
FIG. 14 is a rear view of the diverter shown in FIG. 12.
Figure 15:
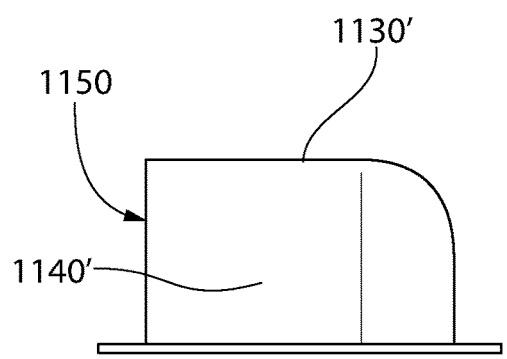
FIG. 15 is a side view of the diverter shown in FIG. 12.
Figure 16:
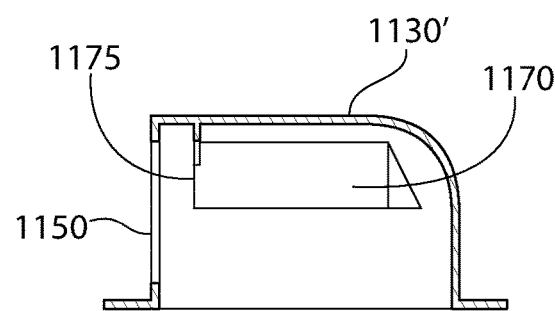
FIG. 16 is a sectional view of the diverter shown in FIG. 12.
Figure 17:
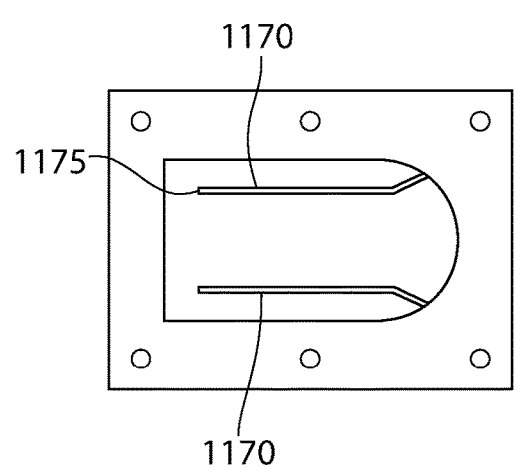
FIG. 17 is a bottom view of the diverter shown in FIG. 12.

FIGS. 6-11 show more detail of the example of diverter 1100 shown in FIG. 5. In this example, diverter 1100 has a main body 1130 and a base 1110. Base 1110 has a plurality (six in this example) of holes 1120 that accommodate fasteners that secure diverter 1100 to roof 10 (by way of mounting plate 1300). Main body 1130 has sides 1140 and a front face 1135. Front face 1135 has an opening 1150. Opening 1150 is configured to receive a tube section (for example tube section 2010 in FIG. 5) and divert gasses from the vent pipe to tube system 2000. As stated above, tube section and opening 1150 are connected in such a way that a gas-proof seal is formed between them. As shown in FIG. 11, the bottom of diverter 1100 has a large opening. This opening is sufficiently large to receive the end of vent pipe 60 (see FIG. 35) in a non-contact arrangement where vent pipe 60 does not contact diverter 1100. Because gasket 1200 forms a gas-proof seal around vent pipe 60, diverter 1100 does not need to form a seal with vent pipe 60. This permits leeway in positioning diverter 1100 relative to vent pipe 60 while still maintaining a gas-proof seal. While the example shown in FIGS. 4 and 5 has opening 1150 of diverter 1100 facing up the slope of roof 10, the above-mentioned leeway allows diverter 1100 to be positioned at any rotational angle relative to vent pipe 60. For example, opening 1150 could face across the slope of the roof (90 degrees from the orientation shown in FIG. 4), or at any other angle. For the proper How of vented gases from vent pipe 60 without the gases being trapped in tube system 2000 or diverter 1100, some embodiments have opening 1150 facing at least partially up the slope of roof 10.

Figure 7:
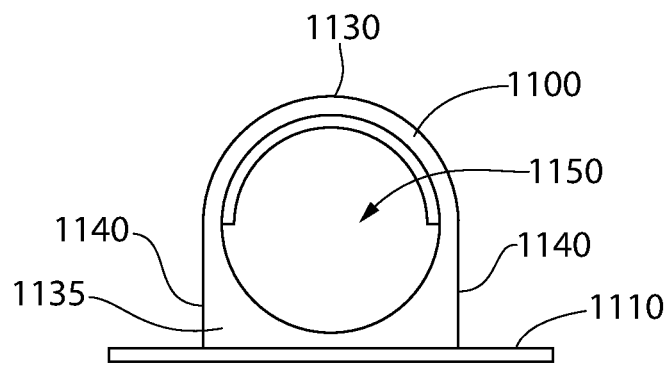
FIG. 7 is a front view of the diverter shown in FIG. 6.
Figure 8:
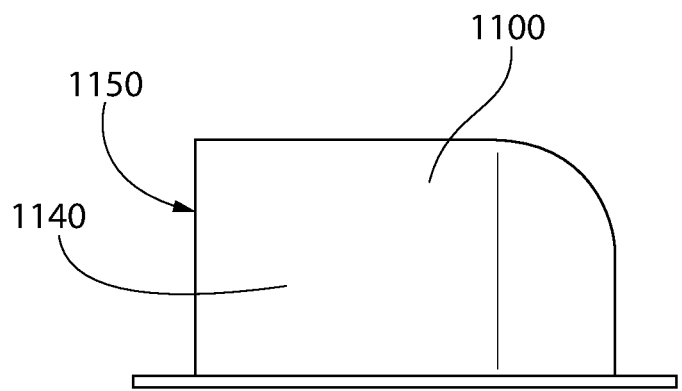
FIG. 8 is a side view of the diverter shown in FIG. 6.
Figure 9:
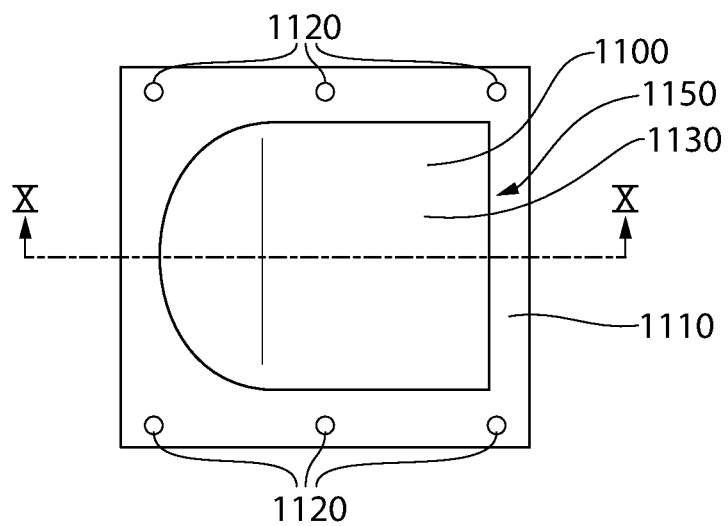
FIG. 9 is a top view of the diverter shown in FIG. 6.

FIGS. 7, 10 and 11 show protuberance 1160 that extends from the inside of diverter 1100 and has end wall 1165 dial acts as a stop feature. End wall 1165 provides a slop that limits how far inside main body 1130 tube section 2010 can extend. By limiting the distance that tube section 2010 can extend inside main body 1130, interference between tube section 2010 and vent pipe 60 is avoided. This can avoid tube section 2010 being pushed too far inside main body 1130 and blocking off, or limiting, gas flow.

The seal provided between vent pipe 60 and gasket 1200 and the seal between diverter 1100 and tube section 2010 create a gas-tight plenum inside diverter 1100 that diverts the gas flow out of the vent pipe in the direction of tube section 2010 without permitting any of the gas from flowing into the space below roof 10. This is done while simultaneously allowing diverting device 1000 to be mounted in many different orientations on roofs of many different pitches. For example, diverting device 1000 can be mounted on a roof having a 6/12 pitch, a 12/12 pitch, or almost any pitch without having to provide any different parts. Also, diverting device 1000 can be mounted in any orientation relative to the slope of the roof without having to provide any different parts.

Figure 18:
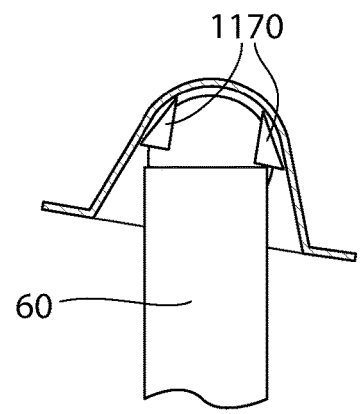
FIG. 18 is a sectional view of the diverter shown in FIG. 12 installed on a vent pipe.

FIGS. 12-18 show a diverter 1100' that is another example of a diverter in accordance with embodiments of the invention. Diverter 1100' is similar to diverter 1100, except that body sides 1140' are sloped, in contrast to body sides 1140 of diverter 1100. The sloped body sides of diverter 1100' allow diverter 1100' to be tilted to a greater degree, as shown in FIG. 18, and still receive the end of vent pipe 60. Such a tilting can be required in an installation where opening 1150 is facing along the slope of the roof as opposed to up the slope of the roof. Diverter 1100' includes a protuberance 1170 having an end wall 1175. End wall 1175 functions as stops similar to end wall 1165 of diverter 1100.

Figure 19:
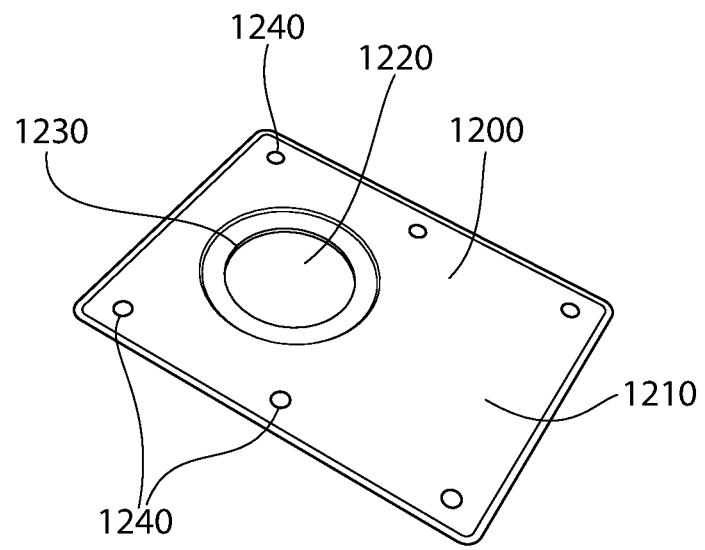
FIG. 19 is a perspective view of an example of a gasket in accordance with embodiments of the invention.
Figure 20:
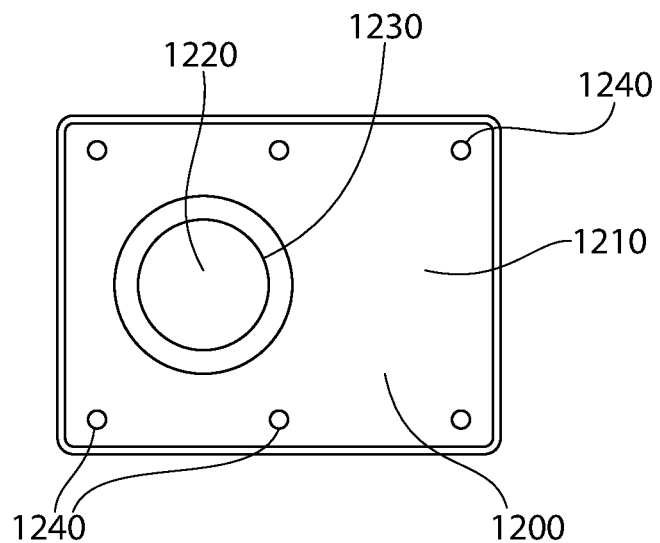
FIG. 20 is a top view of the gasket shown in FIG. 19.

FIGS. 19 and 20 show an example of gasket 1200 that creates a gas-proof seal with vent pipe 60. Gasket 1200 has a main body 1210 and a plurality (six in this example) of holes 1240 that permit fasteners 1310 to penetrate gasket 1200. Gasket 1200 has an opening 1220, with a sealing edge 1230, through which vent pipe 60 passes. Sealing edge 1230 tightly grips the outside of vent pipe 60 to form a gas-proof seal. Opening 1220 is sized to properly seal around commonly used sizes of ABS and PVC pipes used for vent pipes. Sealing edge 1230 can be formed of the same material as main body 1210 or a different material. Sealing edge 1230 can be formed of a material that is sufficiently flexible and expandable to create the required seal around pipes of different diameters (for example, 2 inch internal diameter and 1½ inch internal diameter).

FIGS. 21-25 show another embodiment of a diverter in accordance with the invention. Diverter 3100 functions similarly to diverter 1100 and diverter 1100', however the rounded shape of main body 3130 and body sides 3140 can permit greater flexibility in placement of diverter 3100. The rounded main body shape permits diverter 3100 to be rotated and pivoted to a great degree in order to accommodate a wide range of roof pitches and 360 degree rotation around vent pipe 60.

Figure 21:
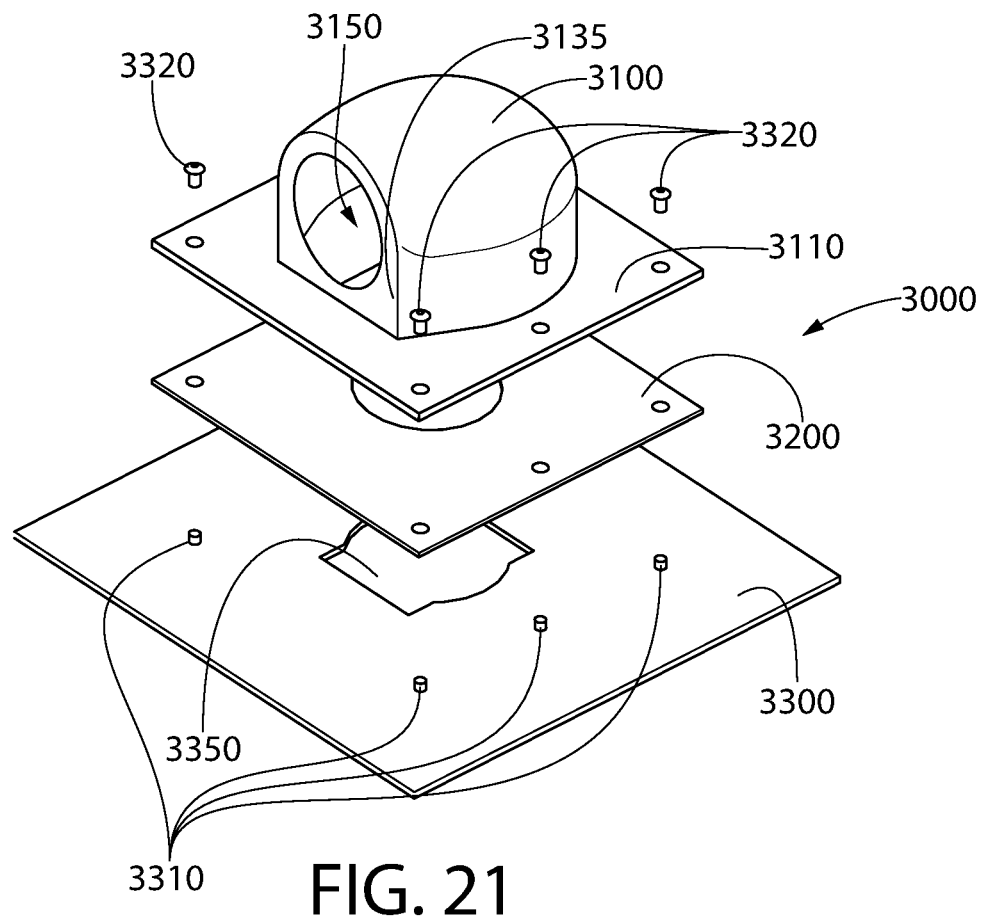
FIG. 21 is a perspective view of an example of a diverter, gasket and plate in accordance with embodiments of the invention.
Figure 22:
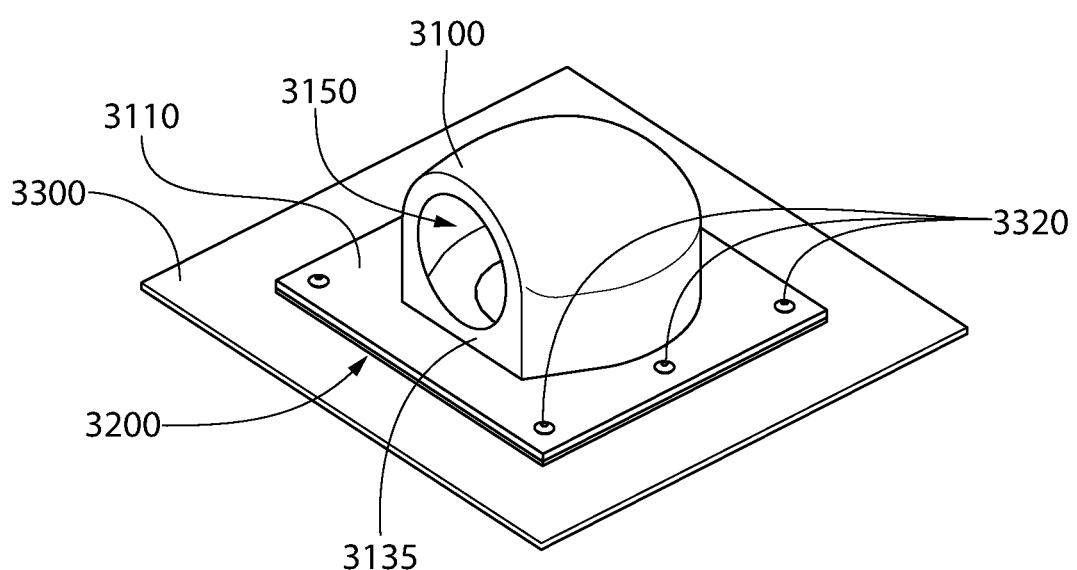
FIG. 22 is a front perspective view of the diverter, gasket and plate shown in FIG. 21 in an assembled state.
Figure 23:
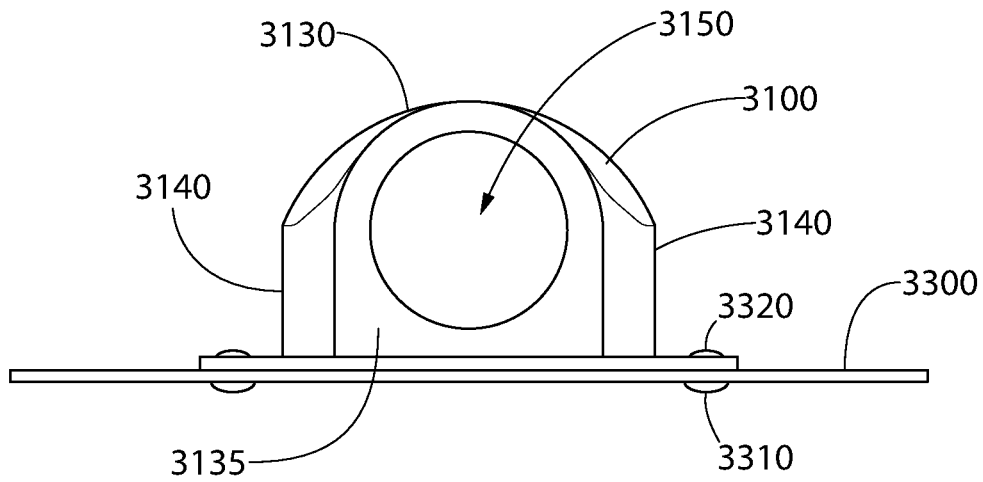
FIG. 23 is a front view of the diverter, gasket and plate shown in FIG. 21 in an assembled state.
Figure 24:
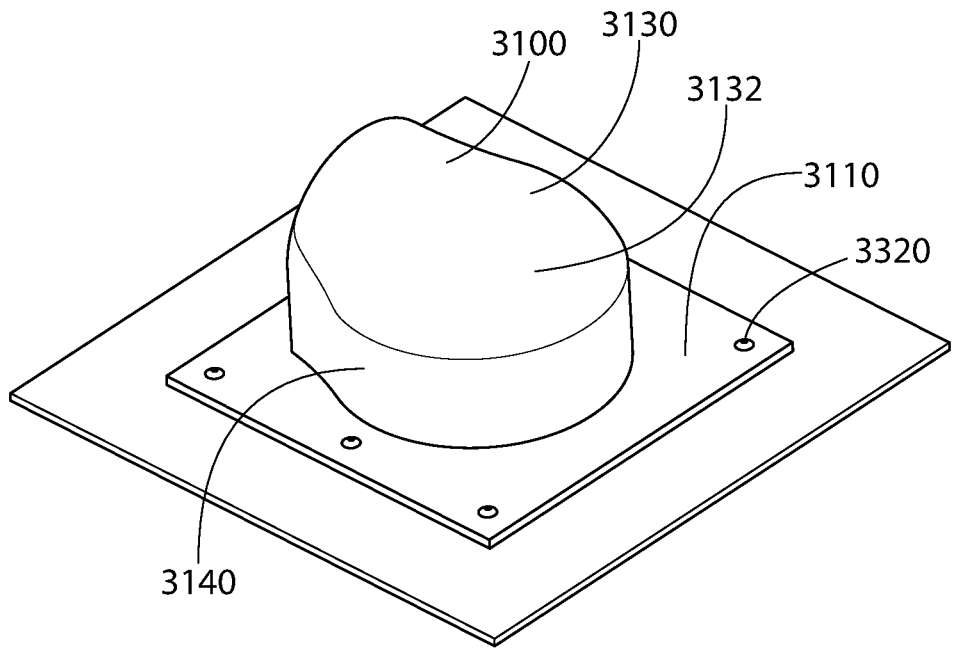
FIG. 24 is a rear perspective view of the diverter, gasket and plate shown in FIG. 21 in an assembled state.
Figure 25:
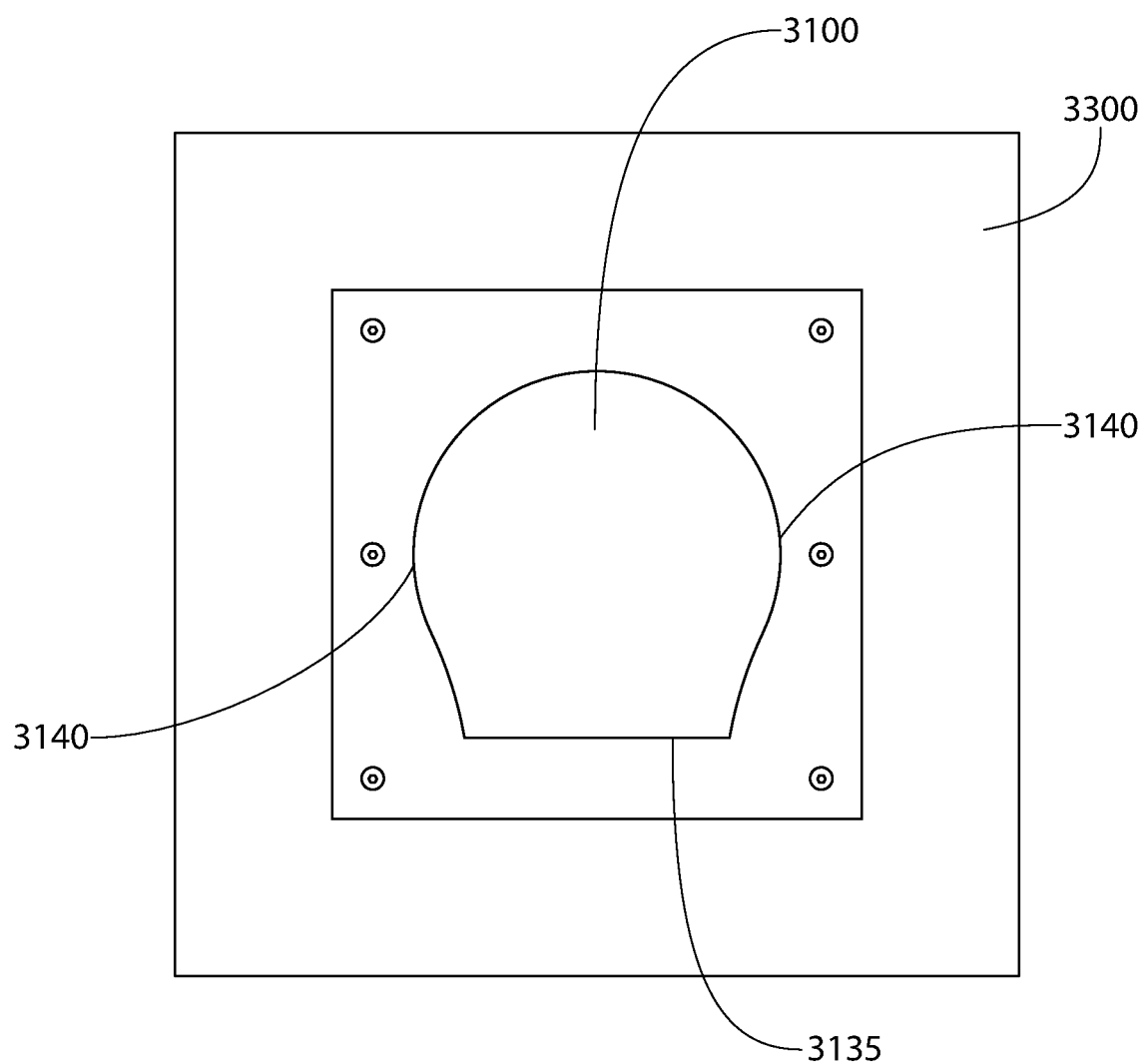
FIG. 25 is a top view of the diverter, gasket and plate shown in FIG. 21 in an assembled state.

In this example, diverter 3100 has a base 3110. Base 3110 has a plurality (six in this example) of holes that accommodate fasteners that secure diverter 3100 to roof 10 (by way of mounting plate 3300). Main body 3130 has, in addition to body sides 3140, a front face 3135. Front face 3135 has an opening 3150. Opening 3150 is configured to receive a tube section (for example tube section 2010 in FIG. 5) and divert gasses from the vent pipe to tube system 2000. Tube section 2010 and opening 3150 are connected in such a way that a gas-proof seal is formed between them. As shown in FIGS. 21 and 22, the bottom of diverter 3100 has a large opening. This opening is sufficiently large to receive the end of vent pipe 60 (see FIG. 35) in a non-contact arrangement where vent pipe 60 does not contact diverter 3100. Because a gasket 3200 forms a gas-proof seal around vent pipe 60, diverter 3100 does not need to form a seal with vent pipe 60. This permits leeway in positioning diverter 3100 relative to vent pipe 60 while still maintaining a gas-proof seal. While the example shown in FIGS. 4 and 5 has opening 1150 of diverter 1100 facing up the slope of roof 10, the above-mentioned leeway allows diverter 3100 to be positioned at any rotational angle relative to vent pipe 60. For example, opening 3150 could face across the slope of the roof (90 degrees from the orientation shown in FIG. 4), or at any other angle. For the proper flow of vented gases from vent pipe 60 without the gases being trapped in tube system 2000 or diverter 3100, some embodiments have opening 3150 facing at least partially up the slope of roof 10. Although the example shown in FIGS. 21-25 has a plate-like gasket, other types of seals can be used including, for example, a seal that is located within diverter 3100.

Figure 26:
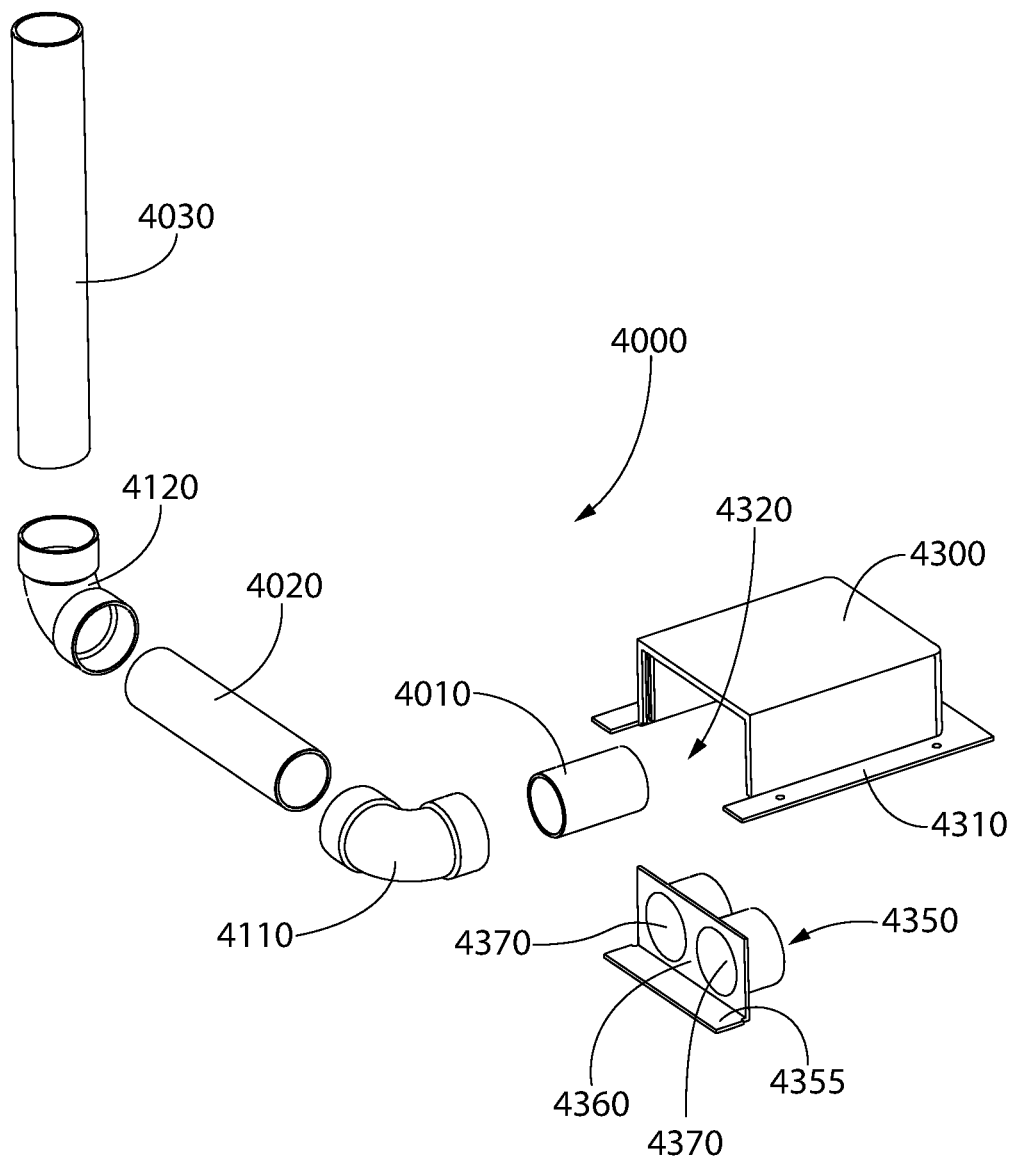
FIG. 26 is an exploded view of an exemplary system in accordance with embodiments of the invention.

FIG. 26 shows an example of a diverting device 4000 that uses multiple tube systems and a distribution box as a diverter. Examples of embodiments such as this can have a seal similar to the gaskets or other seals discussed above with regard to other embodiments. Diverter 4300 is, in this example, formed as a box having an open bottom and an open end 4320. An end plate 4350 is fitted to open end 4320 to provide the number of openings 4370 desired. A plurality (in this example, two) openings 4370 are provided in end plate 4350. A tube system similar to tube system 2000 and including elements 4010, 4110, 4020, 4120 and 4030 is attached in a gas-proof manner to each opening 4370. Flanges 4355 and 4310 are provided on end plate 4350 and diverter 4300, respectively, to facilitate the attachment of diverter device 4000 to the roof. Diverter device 4000 is useful when tire vent pipe is a larger diameter than can be run under the solar panels. By providing multiple tube systems, the gas flow of a larger vent pipe can be split into two smaller diameter tube system while not constricting the gas flow. These smaller diameter tube systems can be of a diameter that can fit underneath the solar panels.

Figure 27:
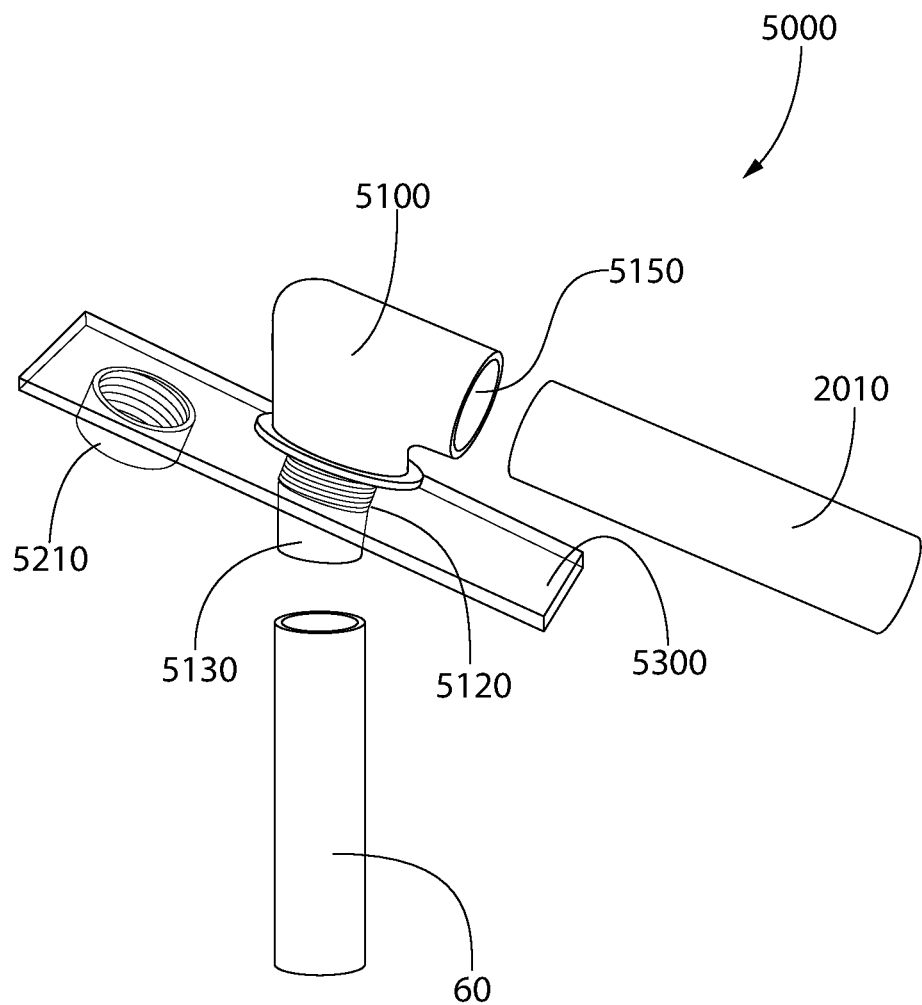
FIG. 27 an exploded view of an exemplary system in accordance with embodiments of the invention.

FIG. 27 shows an example of an embodiment of the invention is which vent pipe 60 is rigidly attached to diverter 5100 to form a gas-tight seal. Diverter 5100 is attached by way of cement or other joining method to tube section 2010 to form a gas-tight seal. Diverter 5100 is attached to a plate 5300 with a threaded collar 5210 and plate 5300 is attached to the roof. Rigid and/or flexible lubes or pipes can be used in tins and any of the other embodiments.

Figure 28:
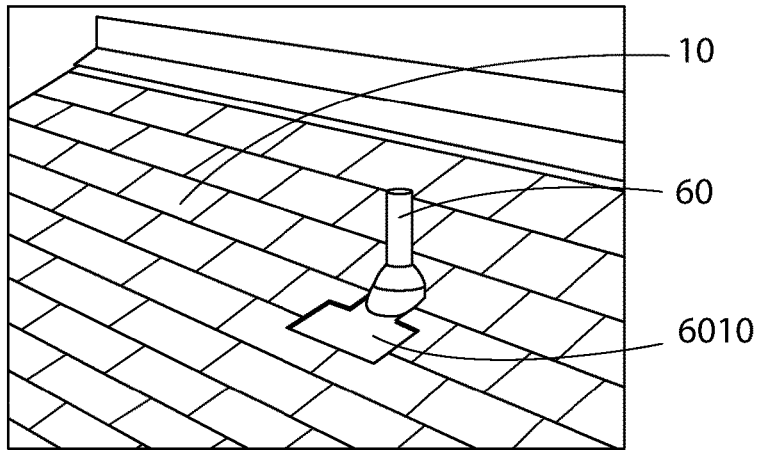
FIG. 28 shows a vent pipe installed in a roof.
Figure 29:
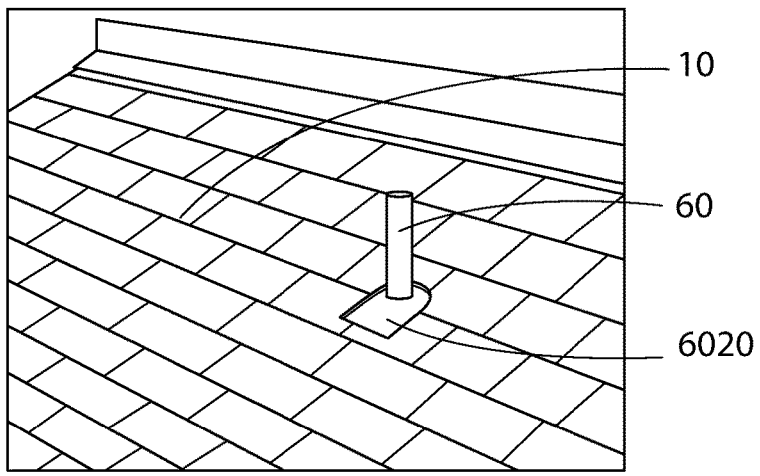
FIG. 29 shows an example of an initial step in an exemplary method in accordance with embodiments of the invention.
Figure 30:
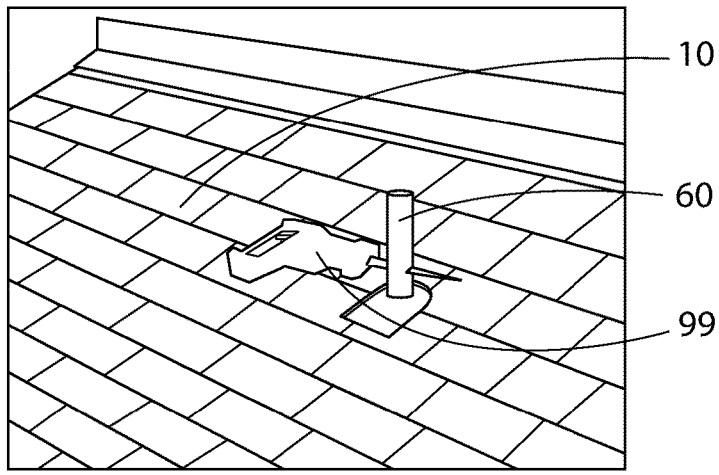
FIG. 30 shows an example of a cutting step in an exemplary method in accordance with embodiments of the invention.
Figure 31:
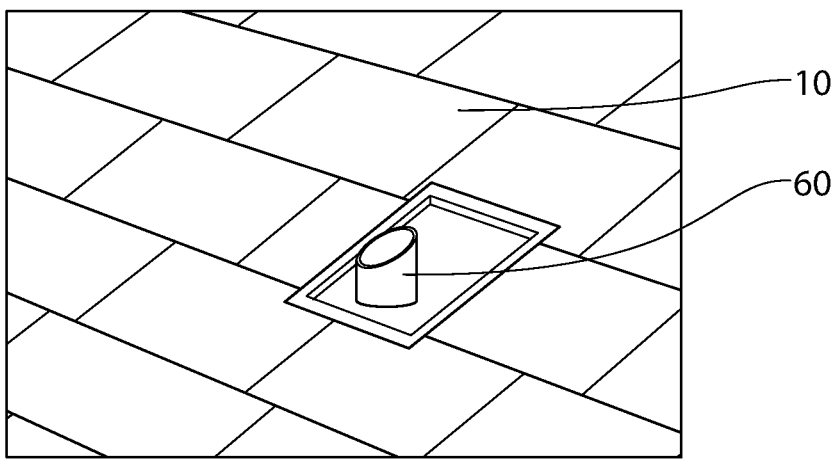
FIG. 31 shows an example of a roof preparation step in an exemplary method in accordance with embodiments of the invention.
Figure 32:
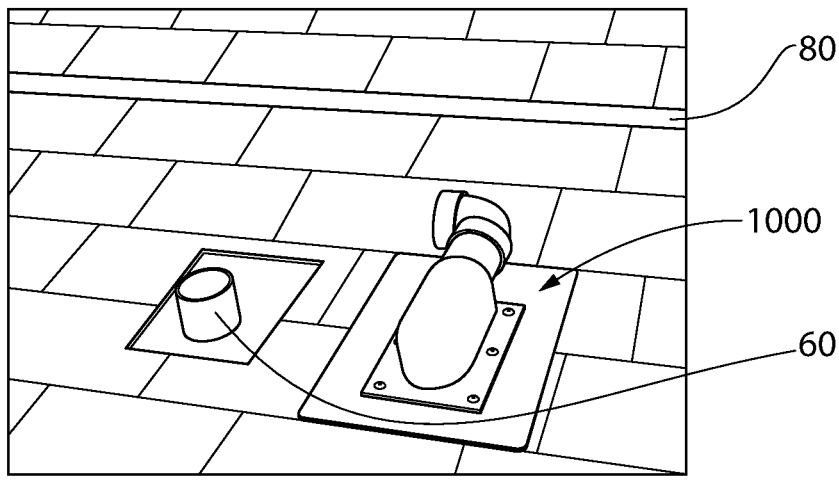
FIG. 32 shows an example of debris deflector in accordance with embodiments of the invention.
Figure 33:
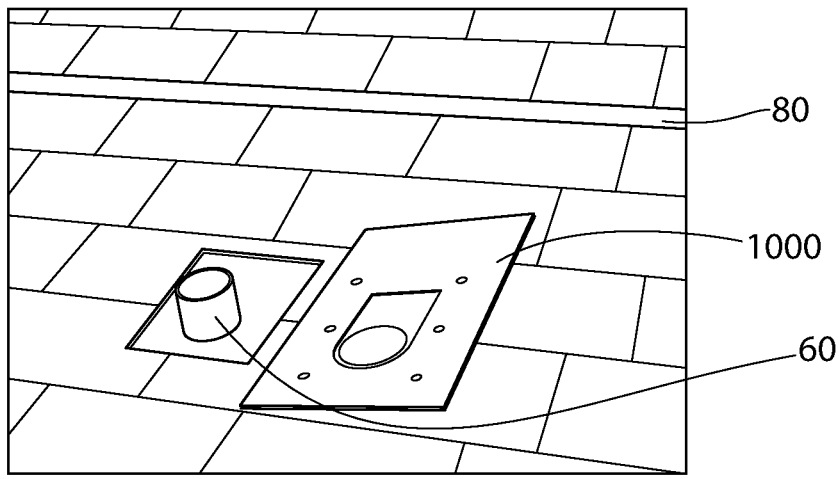
FIG. 33 shows an example of an installation step in an exemplary method in accordance with embodiments of the invention.
Figure 34:
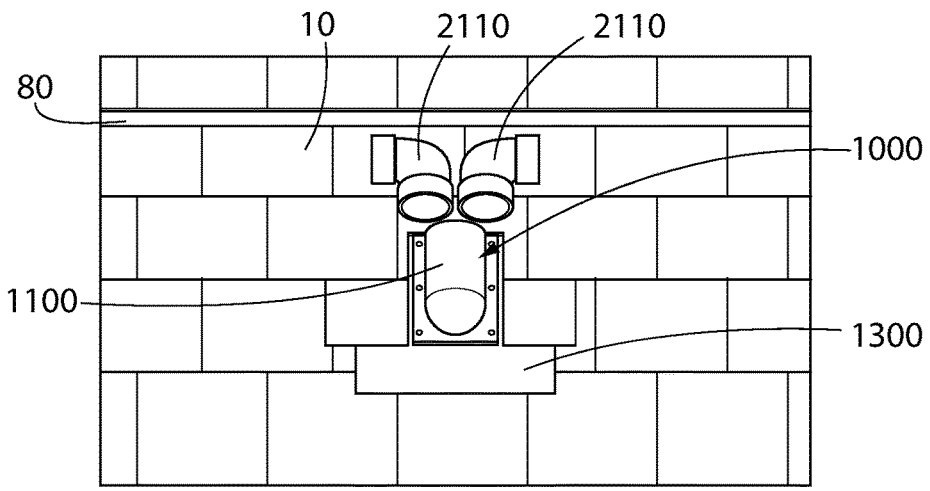
FIG. 34 shows an example of a diverter positioned in an exemplary method in accordance with embodiments of the invention.
Figure 35:
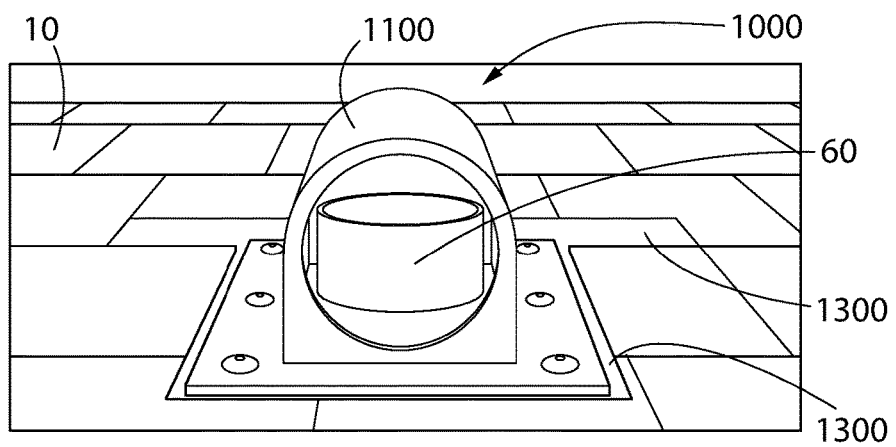
FIG. 35 shows an example of a diverter positioned in an exemplary method in accordance with embodiments of the invention.
Figure 36:
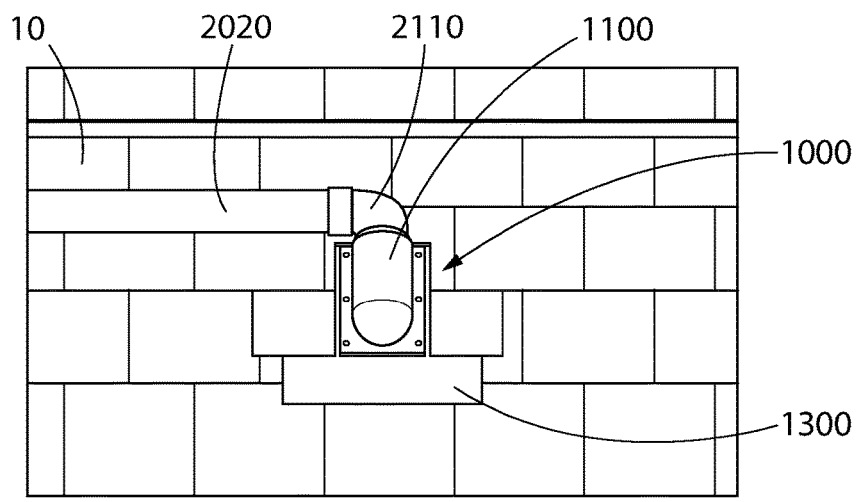
FIG. 36 shows an example of a system fully installed in an exemplary method in accordance with embodiments of the invention.

FIGS. 28-35 illustrate one method of installing a diverting device. FIG. 28 shows an existing vent pipe 60 penetrating a roof 10 and having a flashing 6010. FIG. 29 shows flashing 6010 and a collar removed from vent pipe 60. FIG. 30 shows vent pipe 60 being cut off close to live surface of roof 10. The amount of vent pipe 60 left extending above roof 10 is dictated by the shape and dimensions of the diverter being used. FIG. 31 shows vent pipe 60 cut off to the desired length and an area of shingles removed in preparation for the installation of mounting plate 1300 of diverting device 1000. FIG. 32 shows diverting device 1000 temporarily positioned beside vent pipe 60 to confirm that the area of shingles cleared is an appropriate size. FIG. 33 shows diverting device 1000 upside down to show the opening in the bottom of diverting device 1000 and how it lines up with vent pipe 60. FIGS. 32 and 33 show a debris blocking member such as a channel 80 that redirects water and debris around and away from diverting device 1000 and tube system 2000. FIG. 34 shows diverting device 1000 installed with mounting plate 1300 extending beyond the next row of shingles to provide a water proof installation. Two angled tube sections 2110 are shown positioned temporarily to illustrate that the tube system can be pointed either right or left after it comes out of diverter 1100. FIG. 35 shows a view of diverter 1100 looking down the slope of the roof. This view shows vent pipe 60 extending up into, but not touching, diverter 1100. FIG. 36 shows diverting device 1000 and tube system 2000 in an installed position.

While the foregoing description and drawings represent exemplary embodiments of the present disclosure, it will be understood that various additions, modifications and substitutions may be made therein without departing from the spirit and scope and range of equivalents of the accompanying claims. In particular, it will be clear to those skilled in the art that the present invention may be embodied in other forms, structures, arrangements, proportions, sizes, and with other elements, materials, and components, without departing from the spirit or essential characteristics thereof. In addition, numerous variations in the methods/processes described herein may be made within the scope of the present disclosure. One skilled in the art will further appreciate that the embodiments may be used with many modifications of structure, arrangement, proportions, sizes, materials, and components and otherwise, used in the practice of the disclosure, which are particularly adapted to specific environments and operative requirements without departing from the principles described herein. The presently disclosed embodiments are therefore to be considered in all respects as illustrative and not restrictive. The appended claims should be construed broadly, to include other variants and embodiments of the disclosure, which may be made by those skilled in the art without departing from the scope and range of equivalents. In addition, all combinations of any and all of the features described in the disclosure, in any combination, are part of the invention.

What is claimed is:

1. A device for diverting a flow of gas from a roof-penetrating pipe, the roof-penetrating pipe having a central axis, the device comprising:
   a diverter including a cavity with a lower opening and an upper opening, the lower opening sized to surround an end of the roof-penetrating pipe and leave a gap between the roof-penetrating pipe and the diverter, the gap permitting the roof penetrating pipe to fit within the lower opening at a range of angles between a central axis of the roof-penetrating pipe and a central axis of the upper opening; and
   a gasket having a main body with a seal opening through which the roof-penetrating pipe fits, the seal opening being configured to contact an outer surface of the roof-penetrating pipe and form a gas-tight seal with the roof-penetrating pipe, the main body being configured to contact the diverter and seal around the lower opening,
   wherein, in an assembled state of the device, the gasket is secured to the diverter around the lower opening of the diverter, permits the flow of gas to enter the cavity, and prevents any of the gas that enters the diverter from exiting from the lower opening around the roof-penetrating pipe, and wherein the gasket is flexible and able to provide the gas-tight seal at the range of angles between the central axis of the upper opening and the central axis of the roof-penetrating pipe.

2. The device of claim 1, wherein, in the assembled state, the diverter remains out of contact with the roof-penetrating pipe.

3. The device of claim 2, further comprising a mounting plate that is attached to the diverter with a portion of the main body of the gasket forming a seal between the mounting plate and the diverter.

4. The device of claim 3, wherein the mounting plate is removably attached to the diverter.

5. The device of claim 3, wherein the mounting plate is configured to be attached to the roof.

6. The device of claim 5, wherein the mounting plate is configured to extend under an outer layer of the roof when the device is in an installed state.

7. The device of claim 1, wherein the gasket is configured to mount between the roof and the diverter.

8. The device of claim 1, wherein the range of angles for which the gasket is able to provide the gas-tight seal corresponds to roof pitches from 6/12 to 12/12.

9. The device of claim 1, wherein the gasket is configured to maintain the gas-tight seal at any rotational position relative to the central axis of the roof-penetrating pipe.

10. A system for diverting a flow of gas from a roof-penetrating pipe, the roof-penetrating pipe having a central axis, the system comprising:

a diverter including a cavity with a lower opening and an upper opening, the lower opening being sized to surround and leave a gap around the roof-penetrating pipe, the gap permitting the roof penetrating pipe to fit within the lower opening at a range of angles between a central axis of the roof-penetrating pipe and a central axis of the upper opening;

a gasket having a main body with a seal opening, the seal opening being configured to contact an outer surface of the roof-penetrating pipe and form a gas-tight seal with the roof-penetrating pipe, the main body being configured to contact the diverter and seal around the lower opening;

a first tube section attached to the upper opening of the diverter in a gas-tight manner;

a second tube section that extends vertically away from the roof; and a connector attached to the first tube section and the second tube section such that the first tube section and the second tube section are attached to each other in a gas-tight manner, wherein, in an assembled state of the system, the gasket is secured to the diverter around the lower opening of the diverter and prevents any of the gas that enters the diverter from exiting from the lower opening around the roof-penetrating pipe, and wherein the gasket is flexible and able to provide the gas-tight seal at the range of angles between the central axis of the upper opening and the central axis of the roof-penetrating pipe.

11. The system of claim 10, wherein the range of angles for which the gasket is configured to maintain the gas-tight seal includes angles corresponding to roof pitches from 6/12 to 12/12.

12. A method of diverting a flow of gas from a roof-penetrating pipe that penetrates a roof, the method comprising:

mounting a diverter to the roof with a lower opening of the diverter surrounding the roof-penetrating pipe so that the diverter directs the gas from the roof-penetrating pipe into a cavity of the diverter and out of an upper opening of the diverter; and securing to the diverter a gasket that blocks a gap that extends around the roof-penetrating pipe between the roof-penetrating pipe and the lower opening of the diverter, the gasket having a main body with a seal opening contacting an outer surface of the roof-penetrating pipe and forming a gas-tight seal with the roof-penetrating pipe, the main body of the gasket sealing between the roof and the diverter around the lower opening of the diverter, wherein the gasket prevents any of the gas that enters the diverter from exiting from the lower opening around the roof-penetrating pipe, and wherein the gasket is flexible and able to provide the gas-tight seal at a range of angles between a central axis of the upper opening and a central axis of the roof-penetrating pipe.

13. The method of claim 12, wherein the diverter remains out of contact with the roof-penetrating pipe.

14. The method of claim 13, further comprising attaching the diverter to a mounting plate with the main body of the gasket sealing between the diverter and the mounting plate.

15. The method of claim 14, wherein the mounting plate is removably attached to the diverter and seals against the roof.

16. The method of claim 14, further comprising attaching the mounting plate to the roof.

17. The method of claim 16, wherein the mounting plate extends under an outer layer of the roof when attached to the roof.

18. The method of claim 12, wherein the gasket is mounted between the roof and the diverter.

19. The method of claim 12, wherein the range of angles for which the gasket maintains the gas-tight seal corresponds to roof pitches from 6/12 to 12/12.

20. The method of claim 12, wherein the gasket maintains the gas-tight seal at any rotational position relative to the central axis of the roof-penetrating pipe.

* * * * *